(12) United States Patent
Pohlink et al.

(10) Patent No.: US 7,532,452 B2
(45) Date of Patent: May 12, 2009

(54) HIGHLY TEMPERATURE-STABLE CAPACITOR FOR TAKING MEASUREMENTS ON A HIGH-VOLTAGE LINE

(75) Inventors: Karsten Pohlink, Unterentfelden (CH); Jean-Pierre Dupraz, Bressolles (FR)

(73) Assignee: Areva T&D SA, Paris (FR)

( * ) Notice: Subject to any disclaimer, the term of this patent is extended or adjusted under 35 U.S.C. 154(b) by 310 days.

(21) Appl. No.: 11/344,135

(22) Filed: Feb. 1, 2006

(65) Prior Publication Data

US 2008/0007889 A1    Jan. 10, 2008

(30) Foreign Application Priority Data

Feb. 8, 2005    (FR) .................................. 05 50360

(51) Int. Cl.
*H01G 5/017*    (2006.01)
*H01G 4/005*    (2006.01)

(52) U.S. Cl. .................................... 361/274.1; 361/303

(58) Field of Classification Search ................. 361/303, 361/274.1
See application file for complete search history.

(56) References Cited

U.S. PATENT DOCUMENTS

| | | | |
|---|---|---|---|
| 4,052,668 A | | 10/1977 | Schmitt et al. |
| 4,931,843 A | * | 6/1990 | Goetz ......................... 361/323 |
| 5,444,599 A | | 8/1995 | Dupraz et al. |
| 5,482,793 A | * | 1/1996 | Burns et al. .................... 429/62 |
| 2003/0030962 A1 | | 2/2003 | Gutalj et al. |

FOREIGN PATENT DOCUMENTS

| | | |
|---|---|---|
| DE | 24 09 595 A1 | 8/1975 |
| EP | 0 780 692 A2 | 6/1997 |
| FR | 2 705 492 A1 | 11/1994 |
| FR | 2 828 003 A1 | 1/2003 |

* cited by examiner

*Primary Examiner*—Eric Thomas
*Assistant Examiner*—David M Sinclair
(74) *Attorney, Agent, or Firm*—Oblon, Spivak, McClelland, Maier & Neustadt, P.C.

(57) ABSTRACT

A highly temperature-stable capacitor for taking measurements on a high-voltage line, said capacitor having a high-voltage electrode (HT), an annular printed circuit (CI) surrounding said high-voltage electrode (HT) coaxially and having at least one electrically conductive track that forms a low-voltage electrode (BT), said capacitor being characterized in that the printed circuit (CI) also has at least one temperature-sensitive resistor (TH).

13 Claims, 3 Drawing Sheets

HIGHLY TEMPERATURE-STABLE CAPACITOR FOR TAKING MEASUREMENTS ON A HIGH-VOLTAGE LINE

TECHNICAL FIELD

The present invention relates to a capacitor for taking measurements of the primary voltage of high-voltage equipment. The invention relates in particular to gas-insulated metal-clad high-voltage electrical equipment, such as a gas-insulated cable, or a gas-insulated high-voltage substation element.

STATE OF THE PRIOR ART

Such a capacitor is known from patent documents, e.g. FR 2 828 003 or FR 2 705 492.

The capacitor described in Patent Document FR 2 828 003 has a casing (ENV) connected to a "zero" reference potential, typically to the electrical ground of the host equipment. The casing (ENV) has an annular inside surface against which a printed circuit (CI) is pressed mechanically and resiliently, i.e. in a manner such as to allow the printed circuit (CI) to expand while it remains pressed against the inside face of the casing (ENV).

The element subjected to the high voltage to be measured is connected electrically to a high-voltage electrode (HT) of the capacitor. The high-voltage electrode (HT) of the capacitor is generally constituted by a cylindrical metal bar. It is surrounded by a low-voltage electrode (BT), which is implemented by means of an electrically conductive track of the annular printed circuit (CI). The printed circuit (CI) both mechanically positions the low-voltage electrode (BT) relative to the casing (ENV) and also electrically insulates said low-voltage electrode (BT) from the casing (ENV). The high-voltage electrode (HT), the printed circuit (CI), and the inside surface of the casing (ENV) are assembled together coaxially.

That capacitor structure causes two capacitors to appear, namely a high-voltage capacitor $C_{ht}$ and a low-voltage capacitor $C_{bt}$. The plates of the capacitor $C_{ht}$ are respectively the high-voltage electrode (HT) and the low-voltage electrode (BT), and its dielectric is the gas with which the casing is filled. The plates of the capacitor $C_{bt}$ are respectively the low-voltage electrode (BT) and the casing (ENV), and its dielectric is the substrate of the printed circuit, which substrate is typically made of a composite material based on epoxy resin and on glass fibers, or the like.

The stability and the accuracy of the measurement are dependent on the stability and on the accuracy of the capacitance $C_{ht}$, whose value is given by the following relationship:

$$C_{ht} = 2 \cdot \Pi \cdot \varepsilon_0 \cdot \varepsilon_r \cdot \frac{S}{D \cdot \ln\left(\frac{D}{d}\right)}$$

where $\varepsilon_0$ is the permittivity of vacuum, $\varepsilon_r$ is the relative permittivity of the dielectric gas, D is the diameter of the low-voltage electrode, d is the diameter of the high-voltage electrode, and S is the area of the low-voltage electrode (BT) that is influenced by the high-voltage electrode (HT). If the low-voltage electrode (BT) is implemented in the form of a plurality of electrode elements connected in parallel, S represents the total area of the electrode elements.

In order to obtain a voltage measurement that is of very high accuracy, it is thus necessary to implement a capacitance $C_{ht}$ that is very accurate and very stable.

That type of capacitor is generally associated with high-voltage electrical equipment that is subjected to temperature variations due to climatic conditions and to operating conditions. Such temperature variations typically span the range −25° C. to +55° C. for usual applications, and go well beyond that range for special applications.

Such temperature variations cause the component materials of the capacitor to expand and to contract, which modifies the capacitance of the capacitor $C_{ht}$, unless special precautions are taken. The arrangements described in Patents FR 2 828 003 and FR 2 705 492 are intended to solve those problems of the materials expanding and contracting.

SUMMARY OF THE INVENTION

In addition to the problems of the materials expanding and contracting, the capacitance $C_{ht}$ is dependent on the relative permittivity $\varepsilon_r$ of the gas used as the dielectric. That permittivity is in turn dependent on the density of the gas filling the casing (ENV), which density can vary between a rated filling value and a minimum allowed value due to possible gas leaks. That dependence is expressed by the following relationship, deduced from the Clausius-Mosotti equation:

$$\varepsilon_r = \frac{1 + 2 \cdot k \cdot \rho}{1 - k \cdot \rho}$$

where k is a constant that is characteristic of the gas, related to its electron polarizability and to its atomic mass, and $\rho$ represents the density of the gas. In practice, $k \cdot \rho \ll 1$. Therefore, while maintaining good accuracy, the formula becomes:

$$\varepsilon_r \approx 1 + 3 \cdot k \cdot \rho$$

A technique known from the state of the art consists in continuously measuring the density $\rho$ of the gas in order to make corrections automatically by computing variations in its relative permittivity deduced from knowledge of $\rho$. Said density can be measured either directly by means of a densimeter per se, or indirectly by using a method that consists in measuring the pressure P and the temperature T of the gas, and in computing the density $\rho$ by means of the gas equation, which method is applicable both for a pure gas and for a mixture.

Unfortunately, in practice, the density of gas used in high-voltage equipment is non-uniform, due to the temperature gradients generated by the combined effects of the environment (sun, rain, etc.) and of the heating generated by the primary currents in the equipment. However, the pressure P is uniform, and measuring it poses no difficulties.

An object of the present invention is to continue to solve the problems related to the component materials of the capacitor expanding and contracting, and also to improve the accuracy with which the density $\rho$ is measured by improving measurement of the mean temperature T of the gas between the high-voltage and the low-voltage electrodes of the capacitor $C_{ht}$.

To this end, the invention provides a highly temperature-stable capacitor for taking measurements on a high-voltage line as described in above-mentioned Patent Application FR 2 828 003, said capacitor having a high-voltage electrode (HT), an annular printed circuit (CI) surrounding said high-voltage electrode (HT) coaxially and having at least one electrically conductive track that forms a low-voltage electrode (BT), the capacitor of the invention being characterized in that the printed circuit (CI) also has at least one temperature-sensitive resistor (TH).

A temperature-sensitive resistor is a two-pole component whose resistance varies with a known relationship as a function of the temperature to which it is subjected.

The positioning of the temperature-sensitive resistor on the printed circuit of the low-voltage electrode makes it possible to measure the temperature of the gas between the electrodes of the capacitor as close as possible to the capacitor, and in particular to its dielectric. As in the above-mentioned prior art, the printed circuit is preferably held resiliently against the inside wall of the casing ENV.

In a preferred embodiment of the capacitor of the invention, a metal screen (EM) is interposed between the temperature-sensitive resistor and the high-voltage electrode (HT) so as to protect the temperature-sensitive resistor from the influence of the high voltage.

In another preferred embodiment of the capacitor of the invention, the temperature-sensitive resistor is constituted by at least one electrically-conductive track of the printed circuit.

This configuration of the temperature-sensitive resistor makes it possible to measure the temperature very reliably because it gives a mean view of the temperature over a large area inside the capacitor.

In another preferred embodiment of the invention, the electrically conductive track of the temperature-sensitive resistor is a copper track because copper is the basic material in printed-circuit technology and has thermal properties that are ideal for making temperature-sensitive resistors, in particular for the most common temperature ranges considered for high-voltage equipment.

The capacitor of the invention may, in addition, have the following features:
- the track of the temperature-sensitive resistor and the track of the low-voltage electrode are annular tracks that surround the high-voltage electrode;
- the track of the temperature-sensitive resistor has a shape of the right or slanting Greek frieze pattern type;
- the track of the temperature-sensitive resistor has long, parallel straight-line segments, electrically in series or in parallel;
- the printed circuit is a double-sided printed circuit and the temperature-sensitive resistor is formed via tracks situated on a single side of the printed circuit;
- the printed circuit is a double-sided printed circuit and the temperature-sensitive resistor is formed via tracks situated on either side of the printed circuit;
- the printed circuit is of the multi-layer type and the temperature-sensitive resistor is formed on any one of its embedded or surface layers; and
- the track of the temperature-sensitive resistor and the track of the low-voltage electrode are separated by a guard track connected to a "zero" reference potential.

The track of the temperature-sensitive resistor is flanked on either side by a guard track that is connected to a "zero" reference potential.

In an embodiment, the low-voltage electrode BT is coupled to a circuit which electronically servo-controls its voltage to a reference voltage.

BRIEF DESCRIPTION OF THE DRAWINGS

The present invention will be better understood on reading the following description and on examining the figures that accompany it. The description is given merely by way of indicative and in no way limiting example of the invention. The references used in the following description are the same as the references used above to describe the prior art, when the elements perform the same function as in the prior art. In the figures.

DETAILED DESCRIPTION OF PARTICULAR EMBODIMENTS

Figure 1:
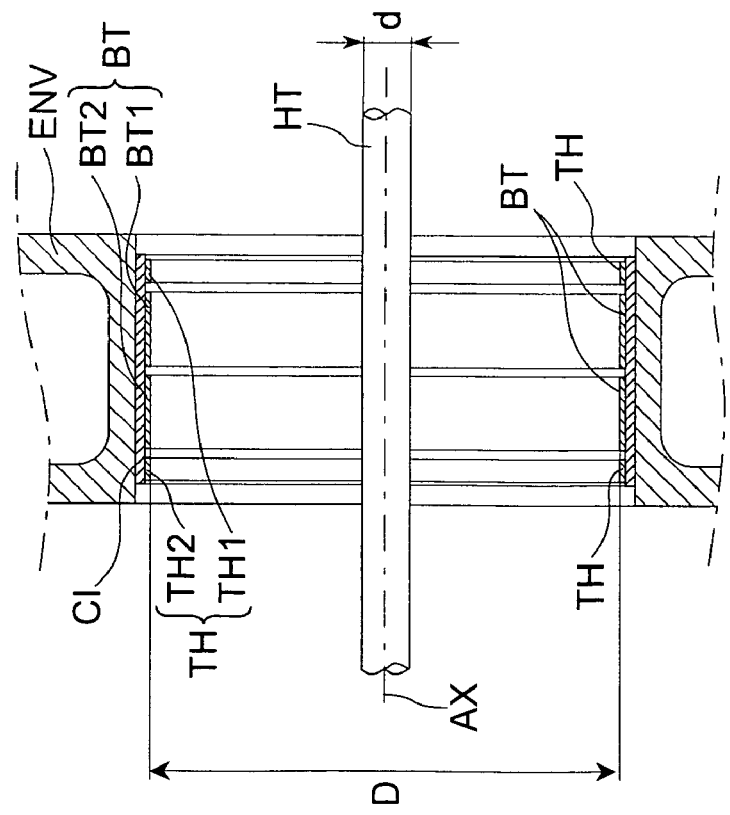
FIG. 1 is a section view of a particular embodiment of a capacitor of the invention.

As shown in FIG. 1, the highly temperature-stable capacitor of the invention is, an annular capacitor. It is a capacitor in which two symmetrical systems are implemented on the same printed circuit, with a view to generating redundancy.

It has a high-voltage electrode HT that extends along a main axis AX. FIG. 1 is a view of a capacitor on a section plane containing said axis AX. The electrode HT which, in this example, is a cylindrical metal bar of diameter d, is surrounded coaxially by a low-voltage electrode BT and by a temperature-sensitive resistor TH, both of which are in the form of electrically conductive annular tracks of an annular printed circuit CI of diameter D. The printed circuit CI is held in a metal casing ENV serving to be coupled to metal-clad equipment filled with a dielectric gas such as sulfur hexafluoride $SF_6$, for example. In this example, the printed circuit CI has two identical and symmetrical subsystems disposed on either side of a plane of symmetry that is perpendicular to the axis AX. Each of the subsystems is formed by a respective wide conductive track BT1, BT2 and by a respective track TH1, TH2, the two tracks BT1 and BT2 together constituting the low-voltage electrode BT, and the two tracks TH1 and TH2 together constituting the temperature-sensitive resistor TH. In particular, each of the tracks TH1, TH2 can take one of the shapes shown in FIGS. 5 to 9. Those figures are described below. The set of four distinct tracks BT1, BT2, TH1, TH2 that are electrically conductive and that are insulated from one another is disposed on the inside face of the printed circuit CI.

Figure 2:
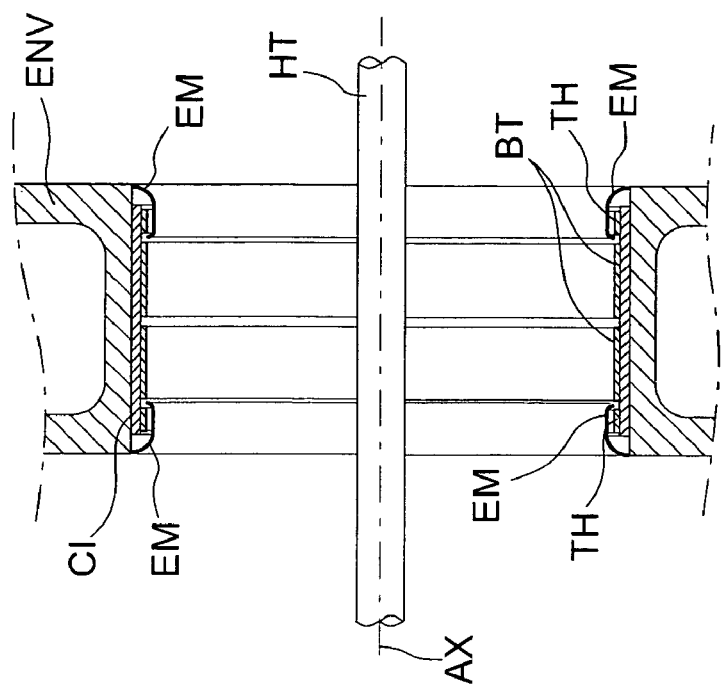
FIG. 2 is a view of the same device as the device shown in FIG. 1, but further having one or more metal screens for protecting the temperature-sensitive resistor.

The tracks BT1, BT2, TH1, TH2 form circular bands that surround the high-voltage bar HT, and they are represented in FIG. 1 and in FIG. 2 by the zones that are darkest and that are closest to the axis of symmetry AX. The bands are spaced apart from one another along the axis AX. The tracks TH1, TH2 of the temperature-sensitive resistor TH, and the tracks BT1, BT2 of the low-voltage electrode BT are not necessarily respectively interconnected at the printed circuit CI. More particularly, the two tracks of the temperature-sensitive resistor TH can act as the temperature-sensitive resistor TH independently of each other, and the number of tracks on the printed circuit can vary. A resistance-measuring instrument (not shown and known per se) is connected to the tracks of the temperature-sensitive resistors TH at points B1 and B2 shown in FIGS. 5 to 9 and measures the resistance at those points. Also, the two tracks BT1, BT2 of the low-voltage electrode BT, which electrodes are not connected to the casing ENV, can act as the low-voltage electrode BT independently of each other. As in other, known capacitors, the low-voltage electrode BT is coupled to the casing ENV, which is itself connected to ground via the capacitance $C_{bt}$. In this way, the high-frequency currents are diverted to ground.

It should be noted that the printed circuit CI can also have a wide conductive track over its outside face, said conductive track being connected to ground via the structure. This provision guarantees that the value of the auxiliary capacitance $C_{bt}$ is kept better under control.

In the capacitor of the invention, temperature is measured by means of a temperature sensor having distributed constants and sharing the same printed circuit CI as the low-voltage electrode BT. Said sensor constituted by the temperature-sensitive resistor TH gives an overall measurement of the temperature over its entire area. Similarly, the low-voltage electrode BT gives an overall measurement of the capacitance $C_{ht}$ over its entire area. The temperature-sensitive resistor TH is formed, in this example, by one or more electrically conductive tracks whose resistivity varies with varying temperature. It can be seen in FIG. 1 that the tracks TH1, TH2 of the temperature-sensitive resistor TH surround the tracks BT1, BT2 of the low-voltage electrode BT so as to measure the temperature as close as possible to the capacitor and over all of the capacitor. Preferably, the electrically conductive tracks TH1, TH2 of the temperature-sensitive resistance TH are made of copper. Copper is in common use in printed circuit technology. It has thermal properties that are ideal for making temperature-sensitive resistors. The resistivity of copper, in the temperature range that is usual in field in question, varies strongly with temperature, as shown by the high value, close to 4000 parts per million and per degree Celsius (ppm/° C.), of its specific temperature coefficient. Printed-circuit technology makes it easy to form tracks whose total electrical resistance is a few tens of ohms. For this purpose, it suffices to choose a class of etching that accommodates the desired copper thicknesses and the desired track widths, such as, for example, in the range 10 micrometers ($\mu$m) to 100 $\mu$m for the track thicknesses and in the range 50 $\mu$m to 500 $\mu$m for the track widths, and to create a pattern of length adapted to the desired resistance. A typical value of 50 ohms is well adapted to such a need, although other values are possible. This value is sufficiently high for measurement to be easy, and sufficiently low to guarantee good immunity from electromagnetic interference.

Starting from the measurement of the resistance R of the temperature-sensitive resistor, the surface temperature of the printed circuit is deduced from the relationship R=f(T), which is a good estimate of the mean temperature T of the dielectric gas of the capacitor. This measurement then makes it possible firstly to correct the effects of the permittivity variations generated by gas leaks, and secondly to correct the residual temperature drift of the capacitance $C_{ht}$ due to expansion and other thermal effects.

Therefore, it is very simple to make a capacitor having a sensor for measuring the temperature of the gas that is inexpensive and that is very compact. Said sensor is situated directly in the zone in which the capacitance is situated, the value of the capacitance making it possible to determine the value of the dielectric constant of the gas.

FIG. 2 shows the same embodiment as in FIG. 1, but this embodiment further includes one or more metal screens EM. As explained above, said metal screen(s) is/are interposed between the temperature-sensitive resistor TH and the high-voltage electrode HT. Said screen(s) protect(s) the temperature-sensitive resistor TH from the direct influence of the high voltage.

The high-voltage electrode HT, the printed circuit CI, the metal screen(s) EM and the inside surface of the casing ENV are, as in the preceding example, assembled together coaxially.

Figure 3:
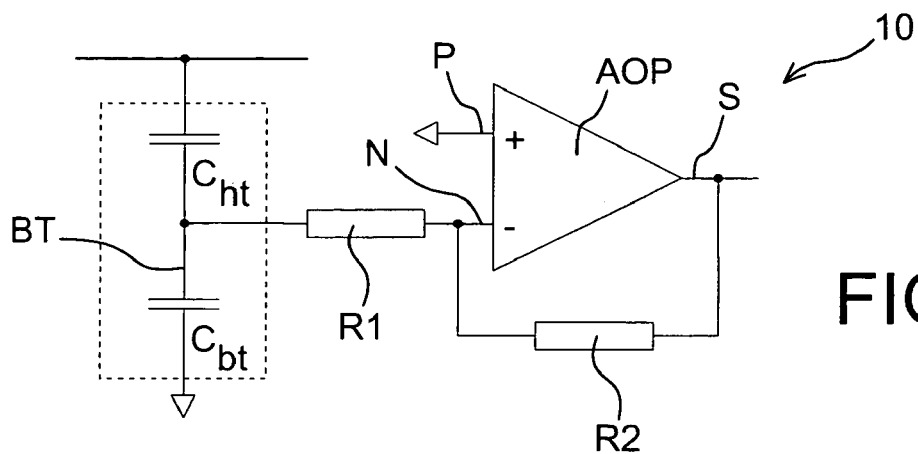
FIG. 3 is a diagram of an electrical circuit designed to keep constant the potential of a junction between the high-voltage and the low-voltage capacitors.

In the preferred embodiment of the invention, the voltage of the low-voltage electrode BT is electronically servo-controlled to a reference voltage, e.g. ground voltage, by means of a circuit 10 shown in FIG. 3.

The low-voltage electrode BT is connected at a first inlet N of a differential amplifier AOP through a first resistor R1, e.g. of resistance of the order of about one hundred ohms. A second inlet P of the differential amplifier AOP is connected to ground which thus constitutes the reference voltage. The outlet S of the differential amplifier AOP is looped back to the inlet N by means of a second resistor R2.

The capacitor $C_{bt}$ appears as an auxiliary capacitor that plays no part in measuring the voltage at industrial frequencies but that grounds the very high frequency interference generated by the movements of switch elements (circuit-breakers or disconnectors) in the network or grid on which the equipment is installed.

The current that then flows through the capacitor $C_{ht}$ and that emerges from the low-voltage electrode BT is thus a faithful image of the time derivative of the voltage of the high-voltage electrode HT. Signal processing (not described herein) makes it possible, e.g. by digital integration, to retrieve an accurate image of the voltage from its time derivative as measured in this way.

Therefore, measuring the voltage applied to the capacitor of the invention reduces to measuring the current flowing through the high-voltage capacitor $C_{ht}$.

Figure 4:
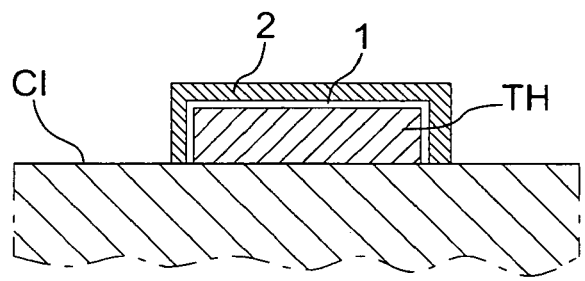
FIG. 4 is a section view of a track of a temperature-sensitive resistor of the capacitor of the invention.
Figure 5:
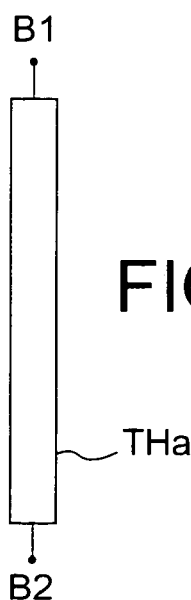
FIGS. 5 to 9 show various possible patterns for a track of a temperature-sensitive resistor of the capacitor of the invention.

FIG. 4 is a section view of a track of a temperature-sensitive resistor of the capacitor of the invention. As shown in FIG. 4, the copper track of the temperature-sensitive resistor TH is preferably covered with protective layers. As shown in FIG. 4, it is possible to deposit successively on the copper track a nickel and gold layer 1 in order to avoid oxidation, and a resist layer of varnish 2.

Figure 6:
Figure 7:
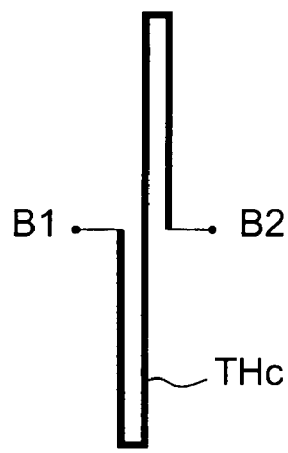
Figure 8:
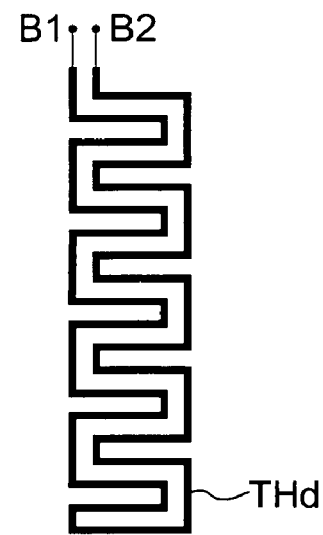
Figure 9:
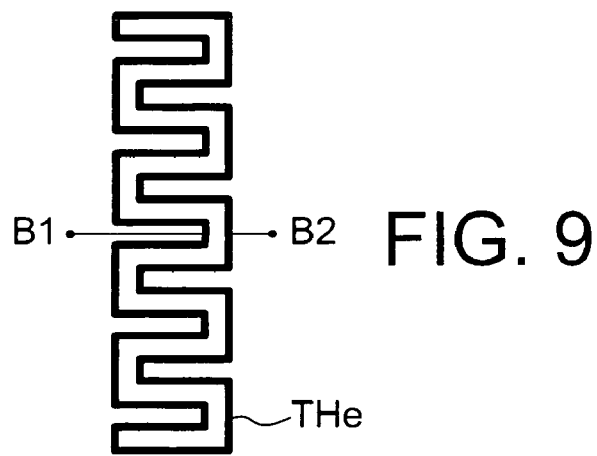

As can be seen in FIGS. 5 to 9, a copper track of the temperature-sensitive resistor TH can have various shapes. Each of FIGS. 5 to 9 shows merely one track pattern that is repeated many times. For example, in FIG. 5, the track of the temperature-sensitive resistor THa is a straight track with connection terminals B1 and B2 at either end. In FIG. 6 and in FIG. 7, the track of the temperature-sensitive resistor, respectively THb and THc, is made up of long, parallel straight-line segments with the two connection terminals B1 and B2 situated on the same side in FIG. 6, and in the center in FIG. 7. The tracks of the temperature-sensitive resistors THd and THe shown respectively in FIG. 8 and in FIG. 9 are of the Greek frieze pattern type, i.e. with chicanes. In a variant, the chicanes can be implemented slantingly. In FIG. 8, the terminals B1 and B2 of the track of the temperature-sensitive resistor THd are on the same side at either end of the track, while in the example shown in FIG. 9, the track of the temperature-sensitive resistor THe forms a closed circuit with terminals B1 and B2 in the center, and thus has the same characteristics as two parallel tracks. The tracks of the temperature-sensitive resistor TH can have numerous other shapes, with connection terminals disposed at suitable places.

The annular printed circuit CI can be made up of a plurality of pieces that then together form a single printed circuit.

The invention claimed is:

1. A highly temperature-stable capacitor for taking measurements on a high-voltage line, said capacitor having a high-voltage electrode (HT), an annular printed circuit (CI) surrounding said high-voltage electrode (HT) coaxially and having at least one electrically conductive track that forms a low-voltage electrode (BT), said capacitor being characterized in that the printed circuit (CI) also has at least one temperature-sensitive resistor (TH), wherein the temperature-sensitive resistor (TH) and the track of the low-voltage electrode (BT) are annular tracks that surround the high-voltage electrode (HT).

2. A capacitor according to claim 1, in which one or more metal screens (EM) is/are interposed between the temperature-sensitive resistor (TH) and the high-voltage electrode (HT).

3. A capacitor according to claim 1, in which the temperature-sensitive resistor (TH) is constituted by at least one electrically-conductive track of the printed circuit.

4. A capacitor according to claim 3, in which the electrically conductive track of the temperature-sensitive resistor (TH) is a copper track.

5. A capacitor according to claim 3, in which the track of the temperature-sensitive resistor (THd, THe) has a shape of the Greek frieze pattern type.

6. A capacitor according to claim 3, in which the track of the temperature-sensitive resistor (THb) has long, parallel straight-line segments.

7. A capacitor according to claim 3, in which the printed circuit (CI) is a double-sided printed circuit in which at least one track of the temperature-sensitive resistor (TH) is formed on each side of the printed circuit.

8. A capacitor according to claim 3, in which the printed circuit (CI) is a multi-layer printed circuit and in which at least one track of the temperature-sensitive resistor (TH) is received on one or more inner layers.

9. A capacitor according to claim 3, in which the printed circuit (CI) is a multi-layer printed circuit in which at least one track of the temperature-sensitive resistor (TH) is received on one or more outer layers.

10. A capacitor according to claim 3, in which the track of the temperature-sensitive resistor and the track of the low-voltage electrode are separated by a guard track connected to a "zero" reference potential.

11. A capacitor according to claim 3, in which the track of the temperature-sensitive resistor is flanked on either side by a guard track that is connected to a "zero" reference potential.

12. A capacitor according to claim 1, in which the low-voltage electrode (BT) is coupled to a circuit (10) which electronically servo-controls its voltage to a reference voltage.

13. A highly temperature-stable capacitor for taking measurements on a high-voltage line, said capacitor having a high-voltage electrode (HT), an annular printed circuit (CI) surrounding said high-voltage electrode (HT) coaxially and having at least one electrically conductive track that forms a low-voltage electrode (BT), said capacitor being characterized in that the printed circuit (CI) also has at least one temperature-sensitive resistor (TH), wherein one or more metal screens (EM) is/are interposed between the temperature-sensitive resistor (TH) and the high-voltage electrode (HT).

* * * * *